United States Patent
Parola et al.

(10) Patent No.: US 9,865,370 B2
(45) Date of Patent: Jan. 9, 2018

(54) METHOD FOR THE PRODUCTION OF A COMPONENT OR A STRUCTURAL PART ON-BOARD A VEHICLE ADAPTED TO INTEGRATE ELECTRICAL DEVICES AND CONNECTIONS, AND COMPOSITE MATERIAL FOR THE REALIZATION OF SAID COMPONENT OR STRUCTURAL PART

(71) Applicant: Plastic Components and Modules Automotive S.p.A, Grugliasco, Turin (IT)

(72) Inventors: Enrico Parola, Turin (IT); Pasquale Iacobone, Potenza (IT); Etienne Valentin, Turin (IT)

(73) Assignee: PLASTIC COMPONENTS AND MUDULES AUTOMOTIVE S.p.A., Grugliasco (IT)

(*) Notice: Subject to any disclaimer, the term of this patent is extended or adjusted under 35 U.S.C. 154(b) by 842 days.

(21) Appl. No.: 14/105,535

(22) Filed: Dec. 13, 2013

(65) Prior Publication Data

US 2014/0167330 A1 Jun. 19, 2014

(30) Foreign Application Priority Data

Dec. 14, 2012 (IT) .............................. TO2012A1083

(51) Int. Cl.
*H01B 1/18* (2006.01)
*B29C 71/04* (2006.01)
(Continued)

(52) U.S. Cl.
CPC .............. *H01B 1/18* (2013.01); *B29C 71/04* (2013.01); *B82Y 30/00* (2013.01); *C08J 5/005* (2013.01);
(Continued)

(58) Field of Classification Search
CPC ............ B29C 71/04; B29C 2105/0015; B29C 2105/0013; B29C 45/0005;
(Continued)

(56) References Cited

U.S. PATENT DOCUMENTS 5,399,295 A * 3/1995 Gamble .................. C08K 7/04
252/511
6,624,383 B1 * 9/2003 Lichtenstein ......... B29C 70/545
219/121.67
(Continued)

FOREIGN PATENT DOCUMENTS

CN 101608067 4/2011
CN 102504389 6/2012
(Continued)

OTHER PUBLICATIONS

Italian Search Report—IT TO 20121083 dated Sep. 3, 2013.
(Continued)

*Primary Examiner* — Yogendra Gupta
*Assistant Examiner* — Emmanuel S Luk
(74) *Attorney, Agent, or Firm* — Howard & Howard Attorneys PLLC

(57) ABSTRACT

A composite material for the realization of a component or a structural part, in particular for installation on-board a vehicle, adapted to integrate electrical devices and connections, includes a non-conductive polymeric matrix; a dispersed phase including at least one promoter of carbonization adapted to form carbonaceous conductive structures; and a reinforcing-fiber filler adapted to direct the distribution and orientation of the dispersed phase in the polymeric matrix.

6 Claims, 5 Drawing Sheets

(51) Int. Cl.
*B82Y 30/00* (2011.01)
*C08J 5/00* (2006.01)
*C08J 5/04* (2006.01)
*C08K 7/06* (2006.01)
*C08K 7/14* (2006.01)
*H05K 3/10* (2006.01)
*H05K 1/03* (2006.01)

(52) U.S. Cl.
CPC ............... *C08J 5/043* (2013.01); *C08K 7/06* (2013.01); *C08K 7/14* (2013.01); *H05K 3/105* (2013.01); *H05K 1/0373* (2013.01); *H05K 2201/0112* (2013.01); *H05K 2201/026* (2013.01); *H05K 2201/0323* (2013.01); *H05K 2201/09118* (2013.01); *H05K 2203/107* (2013.01); *H05K 2203/1136* (2013.01)

(58) Field of Classification Search
CPC ........ B29C 45/0046; B29K 2105/0023; B29K 2105/167; B29K 2309/08; H01B 1/18
See application file for complete search history.

(56) References Cited

U.S. PATENT DOCUMENTS

| | | | | |
|---|---|---|---|---|
| 2009/0056854 | A1* | 3/2009 | Oh | B32B 27/12 156/60 |
| 2011/0134617 | A1* | 6/2011 | Putsch | B82Y 10/00 361/760 |
| 2011/0279989 | A1* | 11/2011 | Kunen | H01L 21/56 361/764 |
| 2013/0255997 | A1* | 10/2013 | Zecchina | H05K 3/105 174/250 |

FOREIGN PATENT DOCUMENTS

| | | |
|---|---|---|
| DE | 299 07 054 | 8/2000 |
| DE | 10 2008 048459 | 3/2010 |
| EP | 1 663 720 | 6/2011 |
| KR | 2010 0105028 | 9/2010 |
| KR | 2012 0077653 | 7/2012 |
| WO | 2007/096016 | 8/2007 |
| WO | 2010/026000 | 3/2010 |
| WO | 2011/129024 | 10/2011 |
| WO | 2012/055934 | 5/2012 |

OTHER PUBLICATIONS

Database Inspec [Online] The Institution of Electrical Engineers, Stevenage, GB; 2007, Chatterjee A et al: "Electrically Conductive carbon nanofiber composites with high-density polyethylene and glass fibers", XP002711198, Database Accession No. 9504289 *abstract* & Materials and Manufacturing Processes Marcel Dekker USA, vol. 22, No. 1-2, 2007, pp. 62-65, ISSN: 1042-6914, DOI: 10.1080/10426910601015931.

Database Compendex [Online] Engineering Information, Inc., New York, NY, US; 2006, Alam M K et al: "Electrically Conductive CNF Composites in a hdpe matrix", XP002711199, Database accession No. E20074910958292 *abstract* & International Sampe Technical Conference—38th Sampe Fall Technical Conference: Global Advances in Materials and Process Engineering 2006 Soc. for the Advancement of Material and Process Enfineering; International Business Office US, *the whole document*.

* cited by examiner

METHOD FOR THE PRODUCTION OF A COMPONENT OR A STRUCTURAL PART ON-BOARD A VEHICLE ADAPTED TO INTEGRATE ELECTRICAL DEVICES AND CONNECTIONS, AND COMPOSITE MATERIAL FOR THE REALIZATION OF SAID COMPONENT OR STRUCTURAL PART

CROSS-REFERENCE TO RELATED APPLICATION

This application is based upon and claims priority to Italian Patent Application TO2012A0010183 filed on Dec. 14, 2013.

BACKGROUND OF INVENTION

1. Field of Invention

The present invention relates to the integration of electrical devices and connections in plastics, and in particular in components or structural parts which are made of non-conductive polymeric material and installed on-board a vehicle. More specifically, the invention relates to a method for the production of a component or a structural part on-board a vehicle that is adapted to integrate electrical devices and connections, and to a composite material for the realization of the component or structural part.

2. Description of the Related Art

In the automotive field, non-conductive polymeric materials are known in the art (for example, polyolefinic thermoplastic polymers which are commercially available as polypropylene (PP) or high-density polyethylene (HDPE)) for the realization of on-board components, including: fuel systems (tanks and other structural parts), internal finishing of the passenger compartment (dashboard, door panels), and external finishing of the vehicle body (bumpers, mouldings).

The on-board electrical or electronic devices which are installed in combination with these components (including sensors, devices for operating on-board systems, and devices for controlling the management of the functions in the passenger compartment) are typically made as discrete elements housed in seats obtained by moulding in the shape of the component. They are connected to remote power supply sources and to remote signal processing components by wiring laid along the chassis of the vehicle.

In order to avoid laying extensive lengths of wiring, different technological solutions have been developed for integrating the electrical connection lines in a plastic matrix, which forms a lining in the passenger compartment of a vehicle (or a structural component of the vehicle). A further development consists of the integration of the on-board electronic devices (for example, the devices for controlling the passenger compartment and bodywork functions) in the plastic components inside the passenger compartment (such as the dashboard and the door panels) where the devices may be embedded and touch-operated.

Published international patent WO 2007/096016 describes a lining for a vehicle in which regions, including switching, sensor, electrical, or electronic signal transmission functions, are formed. On-board functional devices, such as the sensor or control devices, are formed as discrete elements which are arranged in a mould for forming the lining prior to injection of the plastic, so as to surface at the side of the lining facing the passenger compartment, once moulding has been performed, and provide a touch-operation functionality. Flexible conductor strips are embedded in the plastic matrix during moulding for connecting the devices outside of the lining formed.

Published European patent EP 1,663,720 describes a touch-operated device that can be used on-board a vehicle and which includes a capacitive sensor arranged underneath a surface of an internal lining of the vehicle and which can be touch-operated by a person present inside the passenger compartment. Such a device may be integrated in the covering surface of an air-bag, inside a steering wheel, on a dashboard, within an armrest, in a control panel, or in any other surface of a vehicle which is suitable for interaction with on-board electronic devices.

Published German utility model DE 299 07 054 relates to an instrument dashboard, in particular for a motor vehicle, with a support made at least partially of plastic which includes display instruments and operating components that are powered by conductive tracks, in which the conductive tracks are made in electrically conductive plastic (for example, ULTRAFORM® produced by Basf or DURETHAN® and POCAN® produced by Bayer). The conductive tracks are preferably made in a flat form and combined with the support mechanically or chemically (for example, by an injection-moulding process).

Published international patent WO 2010/026000 describes a single-layer or multiple-layer lining for a vehicle, which has regions formed by a mixture of plastic and conductive material. The lining may be used as a part of the interior upholstery of a vehicle (for example, for dashboards or insides of doors). Predetermined areas are provided with conductive tracks for performing electrical conduction functions and more complex switching, sensor, or generally signal transmission functions, wherein the tracks are made of a mixture of plastic materials forming the lining and a conductive material (for example, carbon nanotubes).

A method for producing electrically conductive and/or piezo-resistive tracks on a non-conductive, composite, polymeric substrate including a matrix of commercially available polyolefinic thermoplastic polymers, with a dispersed-phase filler of carbonization promoters (such as carbon nanofibres or carbon nanotubes) is known from published international patent application WO 2012/055934, which teaches how to realize the conductive tracks by laser ablation and consequent localized pyrolysis of the substrate which results in the formation of carbonaceous conductive structures favoured by the promoters, which are able to participate in the conduction by concentration in the tracks.

However, although the aforementioned document suggests (in theory and in laboratory tests) using such a technology for the formation of electrical connections, and simple electrical devices (such as pushbuttons, sensors, antennas, etc.) are incorporated in polymeric substrates widely used in motor vehicles (such as polypropylene and polyethylene), it does not deal with the practical aspect of industrial application of this technology to the manufacture of the aforementioned elements in actual on-board components, nor the integration of the technology with the already established techniques for production of these components.

Components in the automotive field which benefit the most from integration with electrical devices (such as the dashboard or door panels) have particular forms which are determined by the ergonomic requirements associated with their use, or simply by their position in the passenger compartment. In such cases, their shaped forms are determined exclusively by the aesthetic appearance which the designer wishes to give to the passenger compartment of a vehicle, such that it may be distinguished from the design solutions of competitors. Moreover, the industrial technology of injection-moulding in the automotive field is nowadays optimized for the processing of polymeric compounds (which are commonly used for the production of these components), but the technology is not adapted to the processing of compounds with a dispersed-phase filler, the distribution of the filler affecting the electrical properties of the entire component and, even more specifically, the high electrical conductivity values which can be obtained by selective laser ablation of (bidimensional or tridimensional) regions of the component intended to integrate the designed electrical functions.

It is therefore desirable that the technology for the manufacturing of electrical devices and connections incorporated in non-conductive polymeric substrates should be improved for practical application thereof to specific on-board components of a vehicle and, vice versa, that the current technologies for moulding these components in the automotive field should be adapted to the new materials.

The main factors to be considered during the design of a motor-vehicle component using a polymeric material with a dispersed-phase filler having conductive properties which can be locally activated in a selective manner are strictly dependent on the suitability of the component to form conductive tracks with electrical conductivity properties which can be controlled depending on the desired design configurations. For this purpose, during the design of a component, the following parameters must be adjusted: the minimum distance between parallel conductive tracks, in order to prevent interference and short-circuits; the curvatures and plane variations of the conductive tracks, in order to avoid the formation of discontinuities therein; the geometrical configuration of the conductive tracks (length and cross-section) depending on the electrical characteristics of the signal, the polymeric material used and the foreseen electrical load; the geometrical configuration of the component made of polymeric material in the regions designed for an electrical device, in order to define controlled-deformation zones and realize control devices which can be activated by external deformation and pressure stimuli (based on the piezo-resistive effect of the conductive tracks); the geometrical configuration of the conductive tracks in the regions designed for an electrical device, in order to define capacitive proximity sensor zones and form control devices which can be operated by external touching actions, (based on the capacitive effect of the conductive tracks); and the technical solutions for connecting the component containing the conductive tracks to the on-board power supply and/or signal processing systems.

SUMMARY OF THE INVENTION

The object of the present invention is to provide a component (or, a shaped structural part) made of non-conductive, composite, polymeric material, in particular for installation on-board a vehicle, and integrating electrical devices and connections.

A further object of the invention is to provide a precursor, composite, polymeric material adapted to the realization of a component or shaped structural part made of non-conductive polymeric material, in particular for installation on-board a vehicle, and integrating electrical devices and connections.

The general aims underlying the invention are also considered to be those of: increasing energy saving in latest-generation vehicles; increasing the degree of recyclability of the polymeric components; and reducing the costs of acquisition and assembly of accessory components, in particular switches and wiring.

According to the present invention, these objects are achieved by a method for the production of a component or a structural part on-board a vehicle including a substrate of non-conductive polymeric material integrating electrical devices and connections. The invention also relates to a composite material for the realization of a component or a structural part, in particular for installation on-board a vehicle, adapted to integrate electrical devices and connections. Particular embodiments form the subject of the dependent claims, the contents of which are to be understood as forming an integral part of the present description.

The present invention is based on the technology of manufacturing components or structural parts of a vehicle using non-conductive composite polymeric material, including a polymeric matrix with a nano-structured dispersed-phase filler including filamentary nano-structures, promoter of carbonization, for the formation of carbonaceous conductive structures. The invention proposes using laser ablation technology for defining (in components or structural parts of a vehicle) conductive circuits which are entirely carbon-based in order to provide conductive tracks, which are integrated in the polymeric material and form electrical connections or piezo-resistive electrical devices (for example, signal switches which are integrated in the component) obtained by deformation of predetermined areas of polymeric surfaces containing conductive tracks. The invention is based on the principle of associating filamentary nano-structures (promoters of carbonization) which are dispersed in the polymeric matrix and participate in the conduction with a glass-fibre filler which directs the distribution and orientation thereof.

Thus, it is possible to obtain a material with controlled diffusion of the dispersed phase of the conductivity promoters, in order to achieve an as uniform as possible distribution of the filamentary structures (promoters of conductivity) without over-concentrations or under-concentrations, resulting from the composite material injection-moulding technology which adversely affect the electrical conductivity properties of the finished product.

The filamentary structures, promoters of carbonization, include carbon nanofibers or nanotubes. Carbon nanotubes charges in a matrix of polyethylene material produce a technological advantage in the method of forming components because they act as a catalysing agent of the radiation absorption, thus locally increasing the absorption rate of the laser radiation, bringing it from 20-30% to around 80-90% depending upon the wavelength of the incident radiation.

BRIEF DESCRIPTION OF THE DRAWINGS

Further characteristic features and advantages of the invention will be explained more clearly in the following detailed description of embodiments thereof, provided by way of a non-limiting example, with reference to the accompanying drawings in which.

DETAILED DESCRIPTION OF THE EMBODIMENTS OF THE INVENTION

Figure 1:
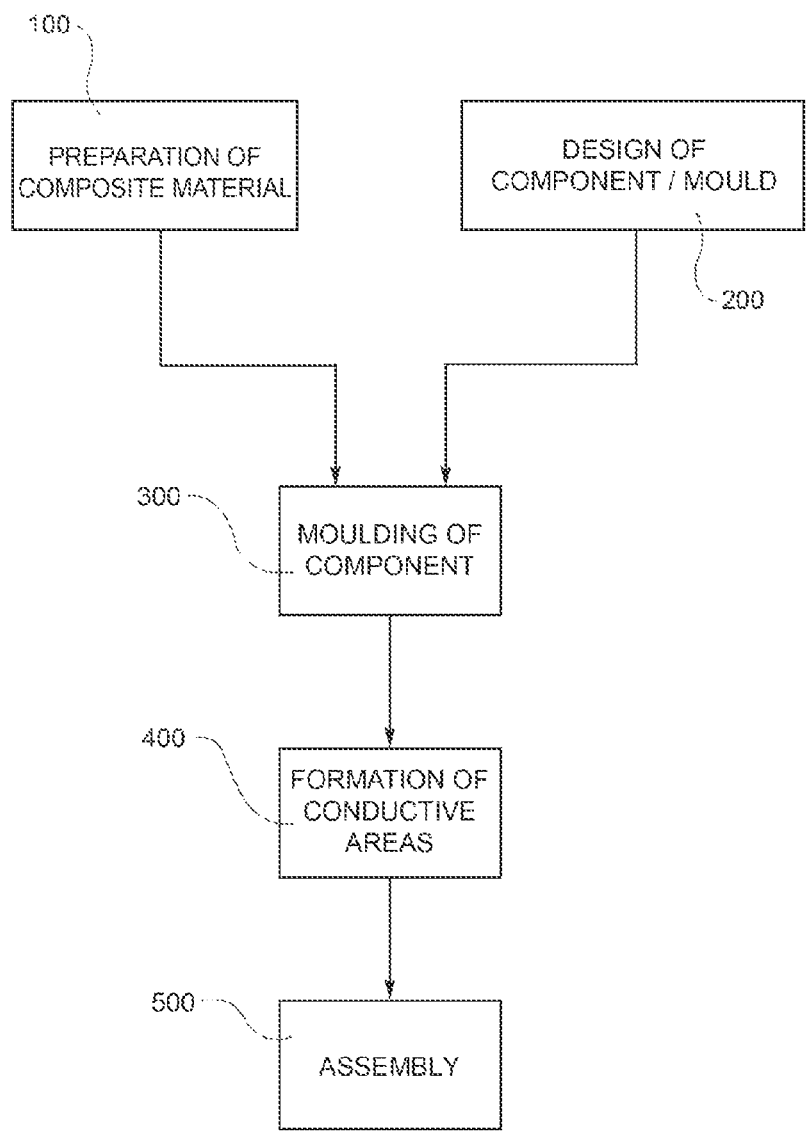
FIG. 1 is a schematic flow diagram illustrating an innovative method for the production of a vehicle component or a structural part made using non-conductive polymeric material and integrating electrical devices or connections.

FIG. 1 shows in schematic form the steps of an innovative method for the production of a component or a structural part for a vehicle, made using non-conductive polymeric material and integrating electrical devices or connections. In step 100 the composite polymeric material is provided, said material including a non-conductive polymeric matrix and a dispersed phase of filamentary nano-structures which are promoters of conductivity. At the same time, in step 200, the design of the component or the structural part of the vehicle and the associated mould for injection-moulding forming of the material produced in step 100 is performed. The step for forming the component or the structural part is denoted by 300 and, in the following, at step 400, definition of the conductive areas or tracks is carried out on the moulded part using the laser ablation writing technique described in published international patent WO 2012/055934. Finally, in step 500, the component or part thus produced, which has predetermined conductive areas forming the electrical devices and connections and is assembled together with other supply components (such as the external connectors).

The provision of the composite polymeric material includes mixing, in a polyolefinic polymeric substrate (for example commercially available polypropylene (PP) or high-density polyethylene (HDPE)) of a phase of filamentary nano-structures, promoters of conductivity, in particular carbon-based nano-structures, such as carbon nanotubes or nanofibres enriched with substances which favour compatibility, namely coupling agents for the reinforcing fibres (for example alkaline hydroxides in aqueous solutions of polymer grafted with maleic anhydride) and a phase of reinforcing fillers, such as glass fibres or fillers of mineral origin. The increase in conductivity in the components made using this polymeric material is greater than the conductivity in the components made of composite polymeric material without reinforcing fibres.

The reinforcing fibres, especially those with short glass fibres, have the effect of increasing the degree of dispersion of the carbon nano-structures which otherwise tend to reaccumulate in the melted mass, creating "islands" which prevent the transit of electric charges in the manufactured article, owing to the Van der Waals forces generated between the chains of nano-structures. This distribution effect also reduces the so-called skin effect (the formation of a surface film of non-conductive polymeric material), allowing the nanotubes to migrate towards the surface, directed by the reinforcing fibres. The reinforcing fibres (in particular the glass fibres) are a reinforcing agent which is widely used in the polymer sector. In tests carried out for optimization of the raw materials to be used in the process described above, it emerged that in a polyolefin (PP, HDPE) based polymeric matrix, to which carbon nanotubes have been added, the presence of glass fibres (preferably in filaments with a length of the order of 5 mm and diameter of the order of 10 µm) increases the electrical conductivity thereof, even without further carbonization treatment, and facilitates the dispersion of the carbon nanotubes. The results demonstrate that a partially conductive interphase is formed between the glass fibre and the polymeric matrix, owing to the carbon nanotubes which tend to line the glass fibre: the local concentration of the carbon nanotubes inside the glass fibre/polymer matrix interphase provides the material with multifunctional properties, including an increase in the mechanical characteristics due to the presence of the glass fibres and an increase in the electrical characteristics due to the presence of the carbon nanotubes.

The coupling agents used to improve the adhesion of the glass fibres in the polymeric matrix improve the distribution of the fibres in the matrix itself, making it practically isotropic: the nanotubes which line the fibres are consequently also uniformly distributed in the polymeric matrix, thereby ensuring the homogeneity of the electrical conductivity in the article. It has been noted in tests that a component made from polyolefinic materials to which carbon nanotubes have been added (owing to the correct dispersion exerted by the glass fibres) has a conductivity at least 100 times greater than an analogous component without a dispersed glass-fibre phase. These results have been obtained with polyolefin-based polymers characterized by carbon nanotube fillers (multiwall CNT) in an amount from 1.5% to 10% by weight and glass fibre fillers in an amount from 10% to 20% by weight, the values being referred to the weight of the composite material.

Figure 2:
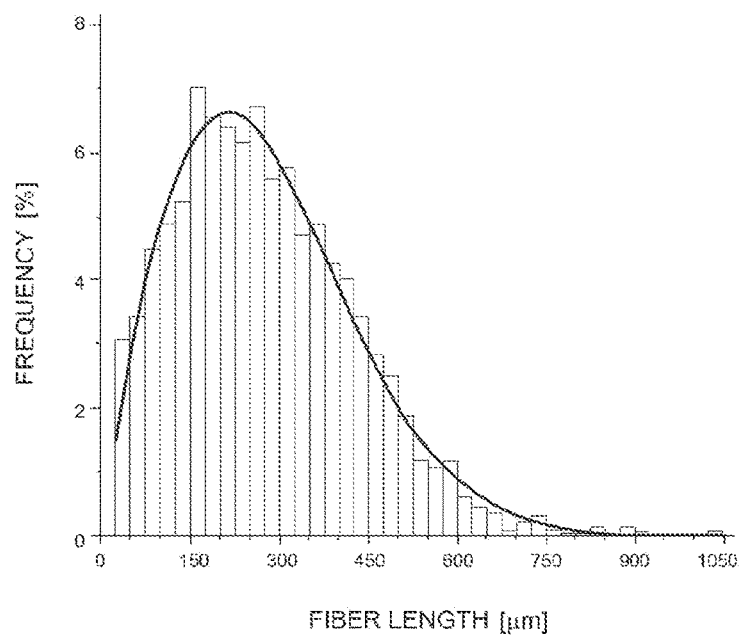
FIG. 2 is a diagram illustrating the characteristic parameters of a step of the innovative method relating to the moulding of a non-conductive polymeric composite material which includes a dispersed phase of filamentary nano-structures, promoters of conductivity, and to which reinforcing fibres have been added.

During the moulding of materials of this type, the flow of the material filling a mould (the dynamic behaviour of which is comparable to that of a high-viscosity fluid) produces complex interactions which result in a fragmentation, so that the lengths of the fibres are distributed in a manner typical of a Weibull distribution, shown in FIG. 2; and a strong influence of the dynamic behaviour of the flow on the arrangement of the fibres which arrange with preferential orientations.

Figure 3:
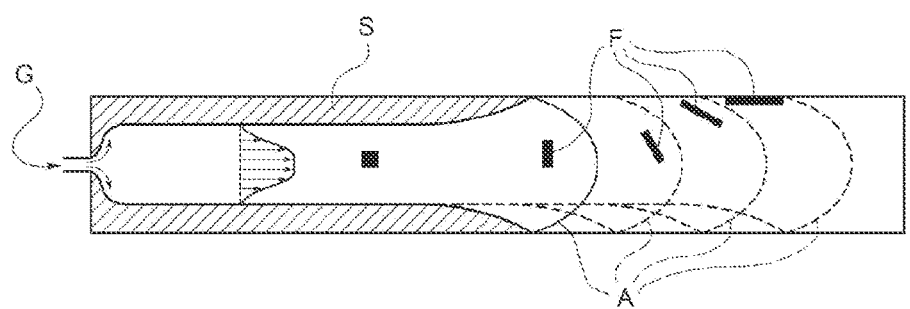
FIG. 3 is a schematic illustration of a step of the innovative method relating to the moulding of a polymeric composite material including a dispersed phase of filamentary nano-structures, promoters of conductivity, to which reinforcing fibres have been added.

In particular, the velocity profile of the flow has a high gradient zone in the vicinity of the mould walls and a zone with a tendentially uniform profile in the central part of the thickness of the mould cavity. Consequently, in the volumes of material which in the centre are subject mainly to transverse deformation, the fibres tend to be arranged in a direction perpendicular to the injection flow, while in the vicinity of the walls the fibres tend to be arranged parallel to the flow, as a result of shearing stresses. This condition is shown in FIG. 3 for a generic mould with a tapered shape provided with an injection nozzle, where G indicates the injection nozzle, A indicates the advancing front edge of the injected flow, F indicates the arrangement of the fibres, and S indicates the volume of solidified composite material.

The fluid-dynamic conditions created during the process of injection of the composite material thus mixed therefore define the orientations of the fibres which in turn determine the mechanical and electrical properties of the component.

Therefore, in order to avoid localized stress of the material during the injection step with an associated loss of the conductive capacities (breakage of nanotubes, deterioration of the matrix, skin effect), during design of the actual mould particular attention must be paid to the following parameters: injection layout, if necessary sequential; mould conditioning layout; and design of the movements of the carriages which are not temperature-regulated.

The component moulding step 300 is therefore dependent on a suitable design of the mould in step 200, which is dependent in turn on the design of the component, not only with respect to the form and volume dimensions, but also to the arrangement of the conductive regions where the integrated electrical connections or devices are to be formed.

The component is obtained by injection-moulding the polymeric compound defined above. Advantageously, the component or the structural part which is to be made must not have small-radius curvatures and the forming mould must have an optimized spatial distribution of the injection nozzles, which are spatially more concentrated (compact) in the electrically functional areas of the part and spatially more spread out elsewhere. The moulding conditions (for example, temperature profiles, velocity profiles, temperature-regulation mode of the mould, injection times, and pressure profiles) determine the electrical conductivity characteristics the manufactured article will have after moulding as well as following the definition of the conductive areas or tracks by writing or laser ablation. The correct setting of these moulding-related parameters is of fundamental importance in order to produce a component which has sufficient levels of internal conductivity (for example of the order of 100 ohm/cm) before laser activation of the actual conductive areas. Incorrect moulding parameters may cause a partially isolating skin effect, which would hinder the subsequent laser writing activation step.

The optimum definition of the moulding parameters is generally dependent on the geometrical configuration of the component and the layout of the mould, such that for each new component to be moulded, associated polymeric material, press type, and mould layout, it is necessary to follow a specific procedure of fine-tuning the initial parameters and defining the optimum operational parameters. For example, in the case of production of a fuel filler nozzle of HDPE-based composite material including carbon nanotubes and glass fibres in the percentage amounts indicated above, tests have revealed the following general setting of the parameters necessary for obtaining a good initial conductivity level: mould temperature-regulated to an average temperature of 60° C.; high injection speed; low holding pressure; and high holding time. In particular, as indicated from the tests carried out, the distribution of the glass fibres, and therefore the distribution of the carbon nanotubes (namely the nano-structures which promote conductivity), and consequently the homogeneity of the electrical characteristics of the moulded article, are affected by the following transformation parameters: melting temperature, mould temperature, cooling time, injection speed and time, injection pressure, plasticization speed, holding time, and pressure.

The tests carried out for components with a volume of about 300 cm3 (such as the fuel filler nozzle) show how it is in any case advantageous to operate using the following moulding parameters: temperature of the material between 190° C. and 260° C.; temperature-regulation of the mould between 50° C. and 70° C.; injection speed of between about 60 and 150 cm3/s (or an injection time of between 3 s and 5 s for a volume of 300 cm3); injection pressure of between 60 bar and 80 bar; holding/cooling time in the mould of between 30 s and 60 s; and holding pressure of between 35 bar and 60 bar.

It is noted that, with the polymeric materials to which carbon nanotubes and glass fibre fillers have been added, there is a variable dispersion of the said fillers, depending on the radial distance from the injection point. In effect, the carbon nanotubes act as a fluidifying agent for the polymer chains: having a smaller size, the hot molecules of polymers "slide" on the nanotubes. This effect results in a high concentration of nanotubes close to the injection point and a smaller concentration of nanotubes far from the injection point. For this reason, in order to ensure that a functional component is obtained (namely one where it is possible to form conductive tracks able to form electrical connections or devices) it is preferable to arrange the injection zones close to the electrically functional areas of the part, namely the areas of the component or structural part which are to be used for formation of electrical connections or devices.

For example, in the case where it is required to form areas with piezo-resistive characteristics (adapted to the formation of switching devices such as the control buttons for apparatus on-board a vehicle) it has been established that the arrangement of the injection nozzles must be within a radius of 30 cm from the area assigned to undergo a subsequent laserwriting treatment for activation of conductive tracks. Greater distances do not ensure an adequate distribution of the glass fibres and the carbon filamentary nano-structures, irrespective of the moulding parameters envisaged.

Once the mould has been prepared, following the design of the component or structural part adapted to integrate electrical devices, or connections and after implementation of the industrial process for moulding this component or structural part, the step for definition and realization of the conductive areas (tracks) is performed. For this purpose, the technique of writing by laser ablation and consequent localized pyrolysis known from international patent application WO 2012/055934, referred to here in its entirety, is applied.

It has been shown that the localized heating produced by a focused laser beam (which induces selective superficial ablation of the polymer matrix) causes the filamentary nano-structures which are dispersed within the matrix to surface and percolate, thus forming a conductive pattern. Moreover, the interaction of the laser beam with the polymer substrate favours the thermal decomposition thereof, and the consequent formation of carbon. The carbon which is formed in this way acts as a bridge between the nano-structures during the process of ablation of the surface layers, further favouring the formation of the electrically conductive areas (tracks).

A laser beam which is precisely focused on the polymer matrix may be used to obtain by ablation deep and stable conductive tracks. The parameter for the minimum distance between the conductive tracks must be controlled in order to prevent interference (crosstalk) between adjacent tracks. For this purpose, it has been noted that in a polypropylene matrix with a mineral reinforcing filler (for example, talc) in an amount of 10% by weight referred to the weight of the composite material, in order to improve the dimensional stability and the rigidity (also including, if necessary, rubber for improving the impact elasticity), and carbon nanotube filler in an amount of 2.5% by weight referred to the weight of the composite material (which ensures an electrical conductivity of 1.6 Kohm/cm) in order that there be no interference between the tracks, a minimum distance of 10 mm must be maintained between adjacent tracks. The width and depth parameter of the laser beam for ablation of the composite material must be controlled so as to obtain a level of specific electrical resistivity of at least 1.6 Kohm/cm on an injection-moulded component with an average thickness of between 2.5 mm and 3.0 mm.

Figure 4:
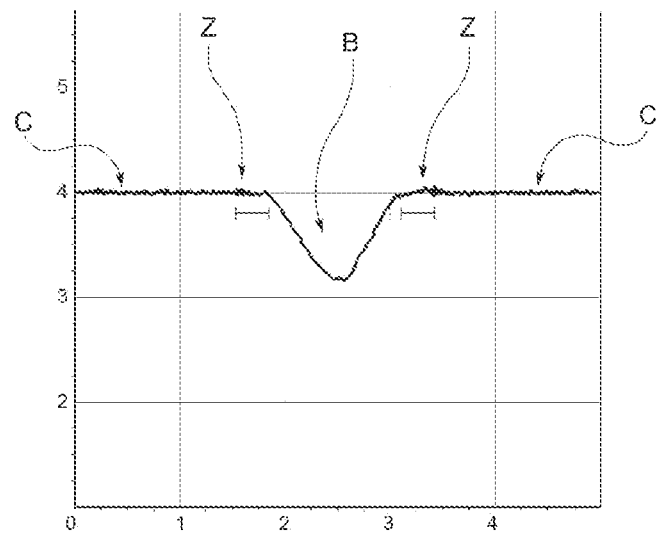
FIG. 4 is a cross-sectional illustration of a process for laser writing a volume of composite polymeric material.

FIG. 4 shows a cross-sectional view of a laser-cut track. As is shown from test results, in order to obtain a level of electrical conductivity of at least 1.6 Kohm/cm, it is necessary to perform a laser incision with a width which is preferably between 1.10 mm and 1.40 mm (even more preferably, equal to 1.25 mm) and a depth preferably of between 0.70 mm and 0.90 mm (even more preferably, equal to 0.80 mm). The focused laser incision forms a groove B in the surface C of the material with an overall triangular and substantially symmetrical cross-section, but other forms (for example, a trapezoidal form) and different orientations may be obtained by controlling focusing and orientation of the laser beam with respect to the surface of the part.

With a laser beam that has a wavelength of 10.6 μm, the optimum speed of laser ablation is 5 mm/min with an effective focal length of 135 mm and an operating power of about 30 W. In order to avoid localized combustion which results in deterioration of the nanotubes, the laser ablation process is carried out in an inert nitrogen atmosphere. It should be noted that a modified thermal zone Z is created in the neighbourhood of the groove (with transverse dimensions of about 0.2 mm), where an electrical conductivity effect may still be detected.

In order to form electrical connections and devices, the geometrical configuration of the conductive tracks (namely the layout of the conductive region), its width and depth, must also be controlled. This is of fundamental importance in the realization of electrical devices, such as switching devices in the form of control buttons integrated in the component (for example, in order to usefully employ the piezo-resistive effect of a conductive track), namely the variation in resistance caused by a suitable mechanical deformation or the capacitive effect of a conductive track, namely the variation in capacity caused by an external body (finger) touching a conductive electrode area.

Figure 5:
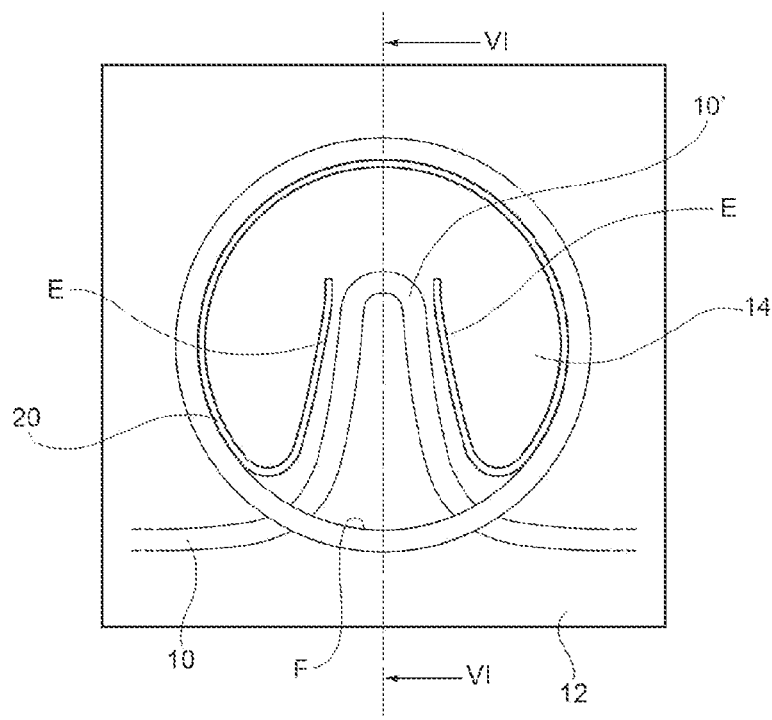
FIGS. 5 and 6 are schematic illustrations, in a plan view and cross-sectioned perspective view respectively, of a piezo-electric operating device integrated in a substrate of non-conductive polymeric material.
Figure 6:
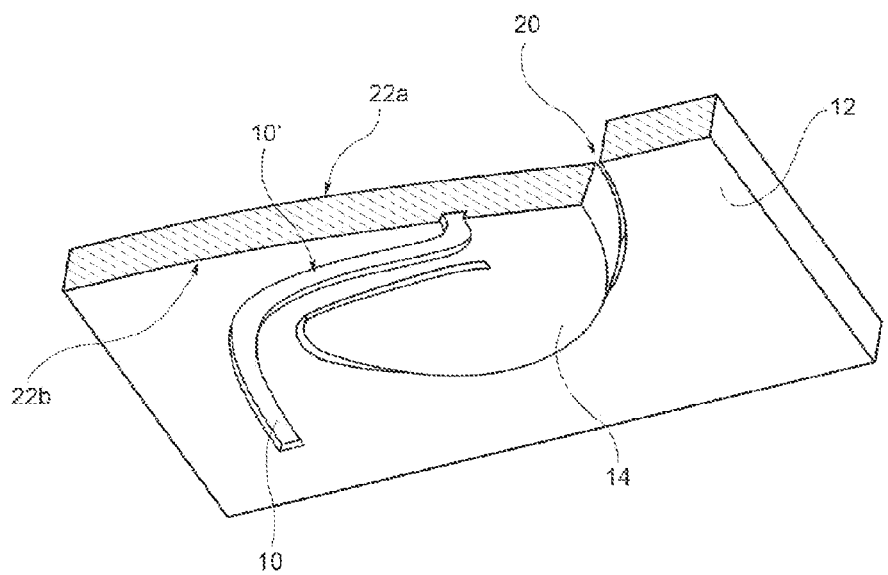

FIGS. 5 and 6 show two schematic illustrations of a control device (button) integrated in a component, respectively in a plan view from above, showing the forms and dimensions thereof, and a partial view simulating the movement of the device in an operating condition. FIG. 5 shows a segment 10 of a conductive track embedded in a matrix of polymeric material 12 in which an operating area 14 able to be acted on by a user is defined. The embodiment illustrated shows an operating area with a circular form (the diameter of which is between 20 mm and 30 mm and preferably 25 mm) defined along a winding section 10' of the conductive track 10, and having a loop-like or meander form, the width of which is between 1.0 mm and 2.0 mm and is preferably equal to 1.5 mm. It is to be understood that the illustration of a substantially bell-shaped loop is purely indicative and that other winding trajectories may also be provided in the operating area 14. Advantageously, the greater the overall length of the conductive track subject to stressing in the operating area (in this case, following a pressure exerted on the area by a user) the greater the effect of variation of the electrical resistivity parameter indicating the action of a user performed on the operating device.

A cut or weakening line 20 (for example, a thinner zone of the material) is conveniently provided on the polymer substrate around the operating area in order to facilitate the mechanical displacement (oscillation) of at least one portion of the operating area of the device with respect to the surrounding surface of the component in which it is integrated, and amplify as far as possible the effect of varying the electrical parameter of the circuit.

FIG. 5 shows an open cut line 20 substantially in the form of cardioid. This cut line defines a base of the operating area 14 (the area between the end segments E of the cut line and the circumferential arc F without the cut line) having a substantially trapezoidal form, which allows the device to operate in the elastic range without undergoing permanent deformation.

FIG. 6 shows a partial, simulated, three-dimensional view of the device obtained by sectioning the device area along the diametral cross-sectional line VI-VI shown in FIG. 5. It is possible to identify a top surface portion 22a which is subject to a tractional force in the operating condition where pressure is exerted on the area of the device, and a bottom surface portion 22b which is subject to compression in the operating condition where pressure is exerted on the area of the device.

During tests, the piezo-resistive effect occurred when a force of 25 N was applied with an elastic deformation of about 3 mm. A corresponding variation in the electrical resistivity between the ends of the winding segment 10' of the conductive track equivalent to 10% was recorded for a resistance (where no force is applied) equal to R=30 Kohm, and a resistance (where a force of F=25 N is applied) equal to R=33 Kohm. The minimum variation in electrical resistivity which can be detected over a background noise resulting from variations in the environmental conditions (for example, temperature or humidity, which also produce dimensional variations in the component) is in the region of 3%.

In general, it was shown that in order for the operating device thus formed to be able to work in the elastic range, the maximum permissible deformation must be equal to about 3 mm. Moreover, in order to obtain the piezo-resistive effect, with the aforementioned characteristics, the operating area 14 should have a thickness greater than 2 mm, and preferably a thickness of 3 mm.

Figure 7:
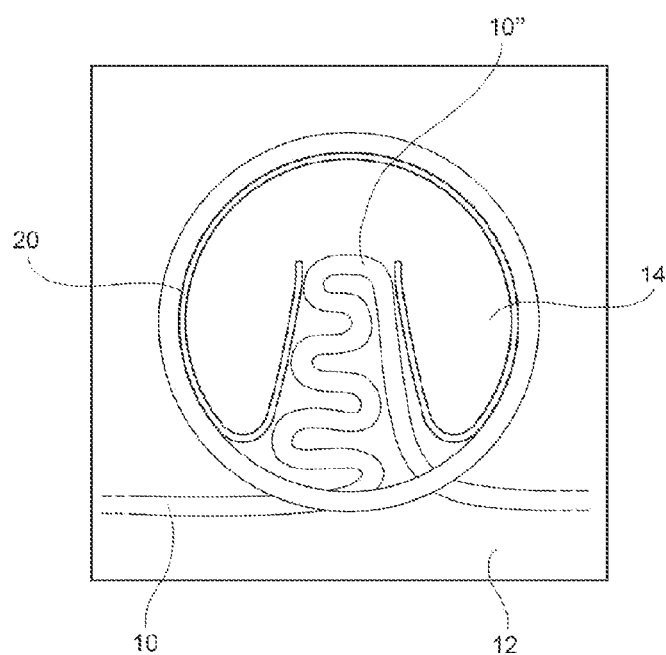
FIG. 7 is a schematic plan view illustration of one embodiment of a piezo-resistive operating device integrated in a substrate of non-conductive polymeric material.

FIG. 7 shows an alternative embodiment of the integrated control device (button) in which the operating area 14 is the same as that shown in FIG. 5 and the segment 10 of the conductive track has a winding section 10'' in the form of a serpentine inscribed in a loop-like or meander envelope curve, with a substantially bell-like form which has a greater overall length subject to stressing in the operating area than the winding section shown in FIG. 5, increasing the variation effect of the electrical resistivity parameter indicating the action of a user on the control device.

The component or structural part realized by applying the process steps described above and integrating electrical devices or connections is assembled together with other components forming part of a supply set (for example, by successive mechanical processing operations such as welding, gluing, etc.) able to integrate the selectively conductive component in a supply assembly for subsequent installation on the vehicle. The component or the structural part has a plurality of metal connection terminals co-moulded on the polymeric matrix, which allow connection of the conductive tracks and the control devices to electrical circuits or systems outside the component, in order to receive or distribute information or power supply current signals.

Figure 8:
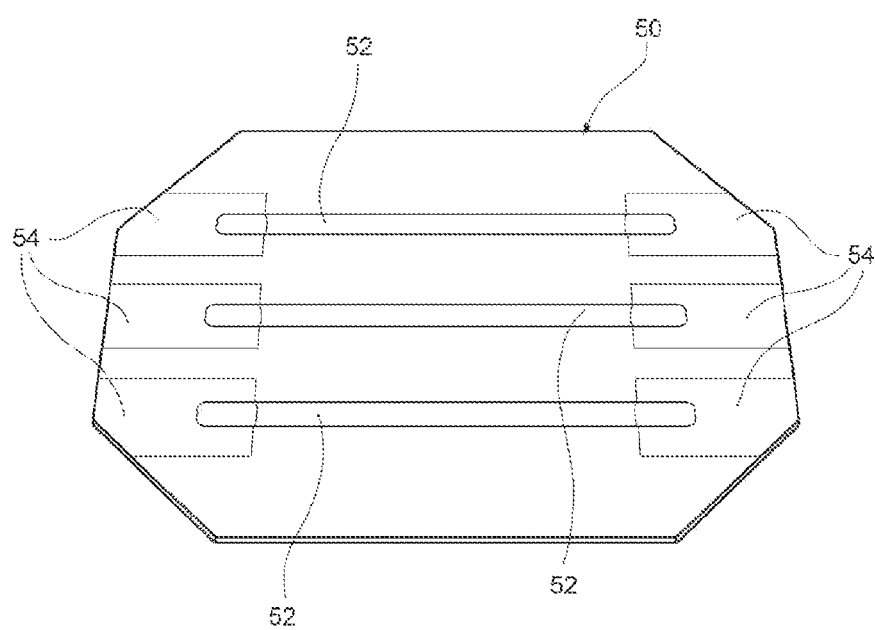
FIG. 8 is a exemplary schematic illustration of the areas of conductivity (conductive tracks) in a composite polymeric material and of corresponding external connection terminals.

FIG. 8 shows a panel of polymeric material, denoted by 50, containing conductive tracks 52 which are, for example, parallel to each other and spaced so as not to cause crosstalk or interference between adjacent connections. The tracks having, coupled to their ends, along the edge of the panel, metal (for example gold) connection terminals 54 for connection to external electrical (signal or power supply) distribution circuits, for example wiring of on-board equipment for receiving operating commands by the control devices (buttons)—not shown—integrated in the polymeric matrix.

It should be noted that the embodiment proposed for the present invention in the above description is intended to be a purely non-limiting example of the present invention. A person skilled in the art may easily implement the present invention in different embodiments which do not depart from the principles illustrated here, and are therefore included within the scope of the present patent as defined by the appended claims.

What is claimed is:

1. A method for the production of a component or a structural part on-board a vehicle, including a substrate of polymeric material integrating electrical devices and connections, including the steps of:
    providing a composite material, comprising:
    a non-conductive polymeric matrix;
    a dispersed phase in the polymeric matrix including at least one promoter of carbonization adapted to form carbonaceous conductive structures; and
    a reinforcing fibre filler adapted to direct the distribution and orientation of said dispersed phase in the polymeric matrix;
    injecting said composite material into a mould for forming the component or the structural part;
    irradiating a laser beam on predetermined areas of the substrate of the component or structural part formed, in such a way as to cause by carbonization the formation of carbonaceous conductive structures, resulting in an improved electrical conductivity of said areas, and define conductive tracks integrated in the polymeric matrix and adapted to form electrical connections or electrical piezo-resistive devices;
    co-moulding on said substrate at least one metal terminal for electrical connection to at least one end of said conductive tracks, located on an edge of the substrate, for connection to external signal distribution circuits.

2. A method according to claim 1, wherein said promoter of carbonization comprises filamentary nano-structures including at least one of carbon nanofibres and carbon nanotubes, in an amount from 1.5% to 10% by weight, referred to the composite material.

3. A method according to claim 2, wherein said polymeric matrix comprises an olefinic polymer.

4. A method according to claim 3, wherein said olefinic polymer is a polypropylene or a high density polyethylene.

5. A method according to claim 2, wherein said reinforcing-fibre filler comprises glass fibres, in amounts from 10 to 20% by weight, referred to the composite material.

6. A method according to claim 5, wherein said reinforcing-fibre filler comprises glass fibres with a length of the order of magnitude of 5 mm and a diameter of the order of magnitude of 10 μm.

* * * * *

UNITED STATES PATENT AND TRADEMARK OFFICE
CERTIFICATE OF CORRECTION

PATENT NO. : 9,865,370 B2
APPLICATION NO. : 14/105535
DATED : January 9, 2018
INVENTOR(S) : Enrico Parola et al.

Page 1 of 1

It is certified that error appears in the above-identified patent and that said Letters Patent is hereby corrected as shown below:

On the Title Page

Item (73) Assignee: delete "MUDULES" and insert therefor --MODULES--.

Signed and Sealed this
Twenty-ninth Day of May, 2018

Andrei Iancu
*Director of the United States Patent and Trademark Office*